(12) United States Patent
Neugirg et al.

(10) Patent No.: US 9,589,922 B2
(45) Date of Patent: Mar. 7, 2017

(54) ELECTRONIC MODULE AND METHOD OF MANUFACTURING THE SAME

(71) Applicant: Infineon Technologies AG, Neubiberg (DE)

(72) Inventors: Christian Neugirg, Regensburg (DE); Andreas Grassmann, Regensburg (DE); Wolfram Hable, Neumarkt (DE); Ottmar Geitner, Pentling (DE); Frank Winter, Regensburg (DE); Alexander Schwarz, Soest (DE); Inpil Yoo, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 264 days.

(21) Appl. No.: 14/214,962

(22) Filed: Mar. 16, 2014

(65) Prior Publication Data

US 2015/0264796 A1 Sep. 17, 2015

(51) Int. Cl.
*H01L 23/373* (2006.01)
*H01L 23/00* (2006.01)

(52) U.S. Cl.
CPC ............ *H01L 24/40* (2013.01); *H01L 23/373* (2013.01); *H01L 24/36* (2013.01); *H01L 2224/40137* (2013.01); *H01L 2924/181* (2013.01); *Y10T 29/4913* (2015.01); *Y10T 29/49144* (2015.01)

(58) Field of Classification Search
CPC .................. H01L 23/4334; H01L 23/373
See application file for complete search history.

(56) References Cited

U.S. PATENT DOCUMENTS

| 2004/0036172 A1* | 2/2004 | Azuma | H01L 23/3128 257/738 |
| 2014/0124918 A1* | 5/2014 | Celik | H01L 23/3738 257/737 |

OTHER PUBLICATIONS

"Aluminum Silicon Carbide (AlSiC) Microprocessor Lids and Heat Sinks for Integrated Thermal Management Solutions", Mark A. Occhionero, Robert A. Hay, Richard W. Adams, Kevin P. Fennessy, and Glenn Sundberg issued at IMAPS Denver Apr. 26-28, 2000.

\* cited by examiner

*Primary Examiner* — Hung V Ngo

(57) ABSTRACT

An electronic module is provided, which comprises a first carrier; an electronic chip comprising at least one electronic component and arranged on the first carrier; a spacing element comprising a surface arranged on the electronic chip and being in thermal conductive connection with the at least one electronic component; a second carrier arranged on the spacing element; and a mold compound enclosing the electronic chip and the spacing element at least partially; wherein the spacing element comprises a material having a CTE value being matched with at least one other CTE.

5 Claims, 3 Drawing Sheets

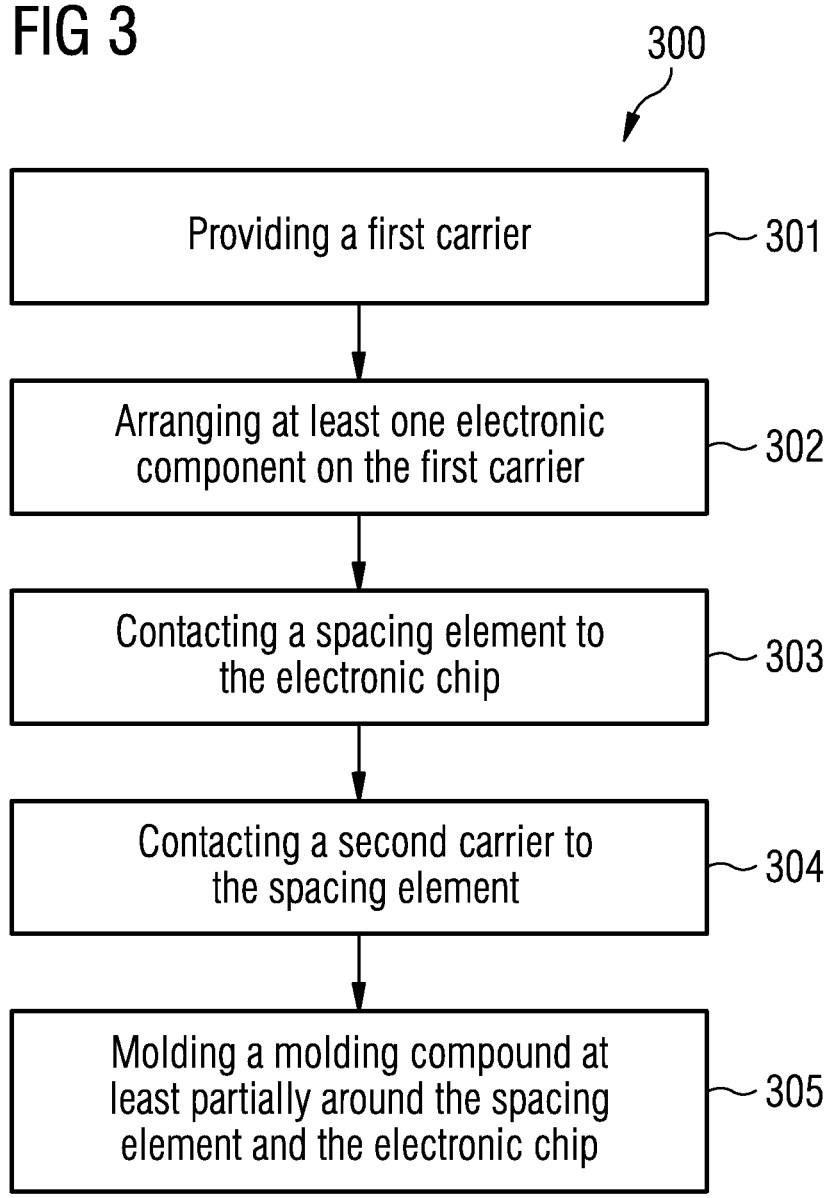

ELECTRONIC MODULE AND METHOD OF MANUFACTURING THE SAME

BACKGROUND OF THE INVENTION

Field of the Invention

The present invention relates to an electronic module. Moreover, the present invention relates to a method of manufacturing an electronic module.

Description of the Related Art

In the art a plurality of electronic modules are known which comprises an electronic or semiconductor chip providing some electronic functionality. The electronic chip may be arranged or placed on a carrier or board and may be housed or packaged by a mold compound enclosing the electronic chip.

In particular, due to the housing by the mold compound the dissipation of heat generated by the electronic chip may be an object. This is particularly true in case the electronic module forms or is part of a power module, i.e. a module adapted and intended to handle a rather high power, e.g. several orders of magnitudes higher than for electronic modules used in the field of information technology.

Such power modules are used in electro motors, e.g. in the field of electric vehicles. These electro motors are typically heavily strained or stressed in operation during the charging and discharging processes leading to a high and rapid heat generation which may be destructive for the function of the batteries and motors. Thus, the dissipation of the generated heat is an important issue to be taken into consideration when constructing or designing such power modules. For example, materials may be used for substrates of a chip mounting or when manufacturing lead frames, wherein the materials having a high thermal conductivity. Additionally, a heat conductive material can be used as a top layer or outer layer of the electronic module in order to provide a large contact area or interface to the environment which may function as a heat sink for the module or package. In order to improve the heat dissipation heat sinks may be provided on both main surfaces of the power module. The heat sinks are thermally coupled to the semiconductor chip wherein one heat sink may be used for cooling one side of the chip while the other heat sink is in thermal contact to the other side. The heat sinks in turn may be thermally coupled to the outside or environment by air convection or liquid cooling.

A further problem which may arise from the relative high charging or discharging currents is the mechanical stress induced due to temperature changes during an operation cycle. Depending on the environmental conditions and the currents temperature changes from −40° to +150° C. may occur, leading to relative high thermomechanical stresses in the electronic module.

While the described electric module may exhibit good quality of function there may still potential room to provide improved electronic modules.

SUMMARY OF THE INVENTION

Thus, there may be a need to provide electronic modules and a method of manufacturing the same wherein the electronic module provides for good operation for a long time, e.g. many temperature cycles, and enabling a low failure rate of the electronic module.

According to an exemplary aspect an electronic module is provided, which comprises a first carrier; an electronic chip comprising at least one electronic component and arranged on the first carrier; a spacing element arranged on the electronic chip and being in thermal conductive connection with the at least one electronic component; a second carrier arranged on the spacing element; and a mold compound enclosing the electronic chip and the spacing element at least partially; wherein the spacing element comprises a material having a coefficient of thermal expansion value being matched with at least one coefficient of thermal expansions selected out of the group of coefficients of thermal expansion consisting of: a coefficient of thermal expansions of the first carrier; a coefficient of thermal expansions of the second carrier; a coefficient of thermal expansions of the electronic chip; and a coefficient of thermal expansions of the mold compound.

According to an exemplary aspect an electronic module is provided, wherein the electronic module comprises: a first conductive board; an electronic chip comprising at least one electronic component and arranged on the first conductive board; a spacing element arranged on the electronic chip and being in conductive connection with the at least one electronic component; a cover layer arranged on the spacing element; and a mold compound enclosing the electronic chip and the spacing element at least partially and having a coefficient of thermal expansion value of x ppm/K; wherein the spacing element comprises a material having a coefficient of thermal expansion value laying in a range between (x−4) ppm/K and (x+4) ppm/K.

According to an exemplary aspect a method of manufacturing an electronic module is provided, wherein the method comprises providing a first carrier; arranging an electronic chip comprising at least one electronic component on the first carrier; contacting a spacing element to the electronic chip; contacting a second carrier to the spacing element; molding a mold compound at least partially around the spacing element and the electronic chip, wherein the spacing element comprises a material having a coefficient of thermal expansion value being matched with at least one coefficient of thermal expansions selected out of the group of coefficients of thermal expansion consisting of: a coefficient of thermal expansions of the first carrier; a coefficient of thermal expansions of the second carrier; a coefficient of thermal expansions of the electronic chip; and a coefficient of thermal expansions of the mold compound.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 3 shows a schematic flowchart of a method of manufacturing an electronic module according to an exemplary embodiment.

DESCRIPTION OF FURTHER EXEMPLARY EMBODIMENTS

Figure 1A:
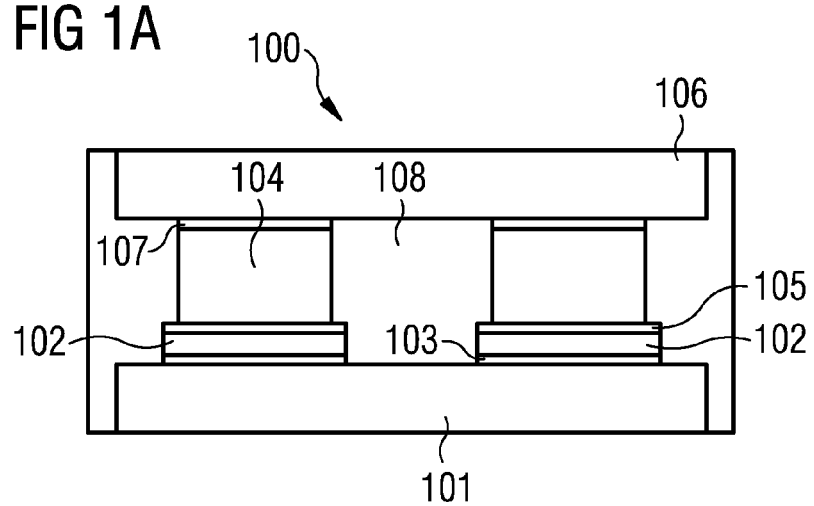
FIGS. 1A to 1C show cross sectional views of an electronic module according to an exemplary embodiment.

In the following, further specific exemplary embodiments of the electronic module and the method of manufacturing the same will be explained. It should be noted that embodiments described in the context of the electronic module may also be combined with embodiments of the method of manufacturing the electronic module and vice versa.

In particular, accordingly a gist of an exemplary embodiment may be seen in providing an electronic module comprising an electronic chip sandwiched between a first conductive board and a spacing element and an adjoining second conductive board, wherein the electronic module comprising a mold compound at least partially enclosing the electronic chip and the spacing element, wherein an coefficient of thermal expansion (CTE) of the spacing element is adapted to at least one coefficient of thermal expansions selected out of the group of coefficients of thermal expansion consisting of: a CTE of the first conductive board, a CTE of the second conductive board, a CTE of the electronic chip and a CTE of the mold compound. In particular, the mold compound may be applied by molding, e.g. by casting or injection molding.

It should be noted that of course one or more of the CTEs of the materials of the electronic module may be matched to each other. In particular, the CTE of the spacer material may be matched with the CTE of the first conductive board and/or the CTE of the second conductive board and/or the CTE of the electronic chip and the CTE of the mold compound. Preferably, the CTE of all these components are matched to each other, e.g. the CTE values of all these components may be in a predetermined range, e.g. may only differ from each other in an interval of ±6 ppm/K or even ±5 ppm/K. It should be noted that as well the CTE of a solder paste may be taken into account when matching the CTEs with each other. Preferably, the matching process may be performed in a way to reduce the mechanical stress induced by temperature changes.

Additionally or alternatively the CTE of the spacing material may be matched to the sum or the mean value of all CTEs of the above described layers or components. For example, the sum or the mean value may be calculated as a weighted sum or mean value, e.g. taking into account the thickness of the different layers or components. Furthermore, it should be mentioned that all CTEs may in particular be measured in a temperature range between 20° C. and 300° C., in particular 25° C. and 150° C. For example, the CTEs may be determined by measuring an extension in one direction at a first temperature, e.g. 25° C. and then measuring the extension in the one direction at a second temperature, e.g. 150° C. and determining then the CTE from the respective measured values. Thus, the CTE may be a mean or average CTE. It should be noted that preferably the different CTEs are measured under the same circumstances and/or by the same determination method.

The term "matched" or "substantially matched" may particularly denote the fact that a difference between the coefficients of thermal expansion (CTE) of the spacer or spacing elements material and of the other element (to which it is matched) may be less than a predetermined threshold value. The respective threshold value may be depending on the specific application for which the electronic module is intended to be used in. For example, the threshold value may be 12 ppm/K, preferably 10 ppm/K or even less, e.g. 8 ppm/K or even 6 ppm/K, all of the stated CTEs may be measured or determined at a temperature of 25° C. or an interval between 25° C. and 150° C. In particular, the CTEs of all described components or compounds, i.e. the mold compound, the spacing element, the first carrier, the second carrier, and the electronic chip may lay in a range of about 3 ppm/K and 15 ppm/K, i.e. in a range of about ±6 ppm/K of a mean value of 9 ppm/K. That is, the value of CTE of the material of the spacing element may be in the range of 9 ppm/K±6 ppm/K, more particularly in the range of 11 ppm/K±3 ppm/K. It should be noted that the term "matched" also includes that the respective material is a result of a deliberately or arbitrarily selection taking into account the CTE of the spacing element material and of the other others materials or elements of the electronic module. It should be distinguished from an accidentally matching resulting by chance. It should be mentioned that when selecting the spacing element material as well the wettability and/or coatability of the spacing material may be taken into account. That is, the spacing material may be a material which can be wetted or coated in a sufficient extent that a soldering step may be performed.

For example, for a typical value of about 10 ppm/K of the CTE for a typical mold compound the CTE value for the spacing element may range between 5 ppm/K and 15 ppm/K which is lower than the CTE of copper which is often used in that field of electronic modules for spacing elements.

In other words the coefficient of thermal expansion of the material of the spacing element (spacing element material) may be adapted to or at least partially matched with the coefficient of thermal expansion of the mold compound or any other compound of the electronic module. In particular, the electronic chip may be soldered to the carrier, e.g. a copper board, aluminium board or direct copper bonding (DCB) board or direct aluminium bonding (DAB) board. In addition or alternatively the spacing element or spacer may be soldered to the electronic chip. Preferably, the material of the spacing element or spacer may be a material which is solderable, i.e. the material may be wettable.

In addition or alternatively the coefficient of thermal expansion of the spacing element material may be matched with the coefficient of thermal expansion of the carriers and/or of the chip.

The term "conductive" may particularly denote the fact that a material, element or structure may be electrically and/or thermally conductive, e.g. may mean that the electrical conductivity or thermally conductivity is above a given threshold, which will be defined by a person skilled in the art according to the given conditions.

In particular, a conductive material may have a high electrical conductivity, e.g. an electrical conductivity being above a predetermined threshold. The predetermined threshold may be in particular $1*10^6$ S/m, preferably $10*10^6$ S/m, more preferably $15*10^6$ S/m, and even more preferably $20*10^6$ S/m.

In particular, the spacing element comprises a conductive material. For example, the conductive material may be thermally and/or electrically conductive. The spacing element may also fulfil a levelling effect balancing differences in height of components or layers of the electronic module. In particular, the electronic chip may comprise or may be formed by a power transistor, i.e. a switching element suitable for switching electrical power in the amount of several tens or hundreds of watts. Such power transistors have to be distinguished from transistors used for switching information signals, e.g. in integrated circuits of a processor or memory. Alternatively, the electronic module may comprise a dense array of electronic circuits. It should be noted that the spacing element or spacer may be used for providing an electrical path from the electronic chip to another component of the electronic module and/or to the exterior of the electronic module. That is, the spacer may be part of the electrical circuit or circuitry formed by or in the electronic module.

By providing an electronic module comprising a spacer or spacing element comprising a material having a CTE matched to at least on other component of the electronic module, it may be possible that delamination of the mold compound and/or between the electronic chip and the spacing element and/or the mold compound is reduced. Such a delamination may particularly occur due to different thermal expansion (during operation) of the mold compound and of the electronic chip and/or the material of the spacing element and may lead to the failure of the electronic module, e.g. due to breaking of electrical paths from and to the electronic component. In particular, an improved electronic module may be provided which may fulfil its functions for more temperature cycles, i.e. heating up and cooling down again, without breaking of electronics or electric paths in the electronic module due to delamination effects, for example.

In particular, the electronic module may be a power module, e.g. a power transistor or a similar electronic module adapted to withstand high voltage. The term "high voltage" may particular denote a voltage which is higher than typical voltages used for information signals. For example the power transistor may withstand a voltage of hundred or even several hundreds of volts. In particular, the electronic chip may be electrically connected to the carrier or conductive board, e.g. by wire bonding, soldering or surface mounting technology.

It should be noted that the electronic module may comprise additional spacing elements which may be arranged laterally with respect to each other and/or may be arranged vertically with respect to each other, i.e. may form a stacked arrangement. Additional, several electronic chips may be arranged horizontally and/or vertically with respect to each other in or at the electronic module. The mold compound may comprise a thermoplast material, a thermoset material, a plastomere material or an epoxy material.

According to an exemplary embodiment of the electronic module the matching is performed in such a way that a mechanical stress in the electronic module due to temperature changes is minimized.

In particular, several or all of the cited component may comprise or may consist of a material having a CTE which is selected in such a way that the overall mechanical stress due to temperature changes, e.g. during a typical thermocycle, is minimized or at least below a predetermined threshold. A sufficient threshold may be defined by a number of thermocycles which the electronic module has to withstand without delamination of components or breakages of electrical paths or connections. Thus, thresholds may be defined in specific test standards, e.g. in automotive standards, defining a minimal robustness. For example, the respective electronic module may fulfil the AEC-Q100 or the AEC-Q101 standard. It should be mentioned that the matching of the CTEs of specific components may be more important with respect to the resulting mechanical stress than for other components. For example, while solder paste used for soldering processes may still have a relatively high CTE value compared to other components the influence of its CTE may be less important than the influence of other components like the spacing element, the carriers or the mold compound. However, when selecting or matching the CTEs the one of the solder paste may as well be considered or taken into account.

According to an exemplary embodiment of the electronic module the matching is performed in such a way that values of coefficient of thermal expansion of the spacing element material and of the matched coefficient of thermal expansion is within a range of ±6 ppm/K.

According to an exemplary embodiment of the electronic module the coefficient of thermal expansion of the spacing element material is in the range of 6 ppm/K and 16 ppm/K.

In particular, the CTE may be in the range of 7 ppm/K and 15 ppm/K or even in the range of 8 ppm/K and 14 ppm/K. It should be noted that the According to an exemplary embodiment of the electronic module the spacing element material has an electrical conductivity above a predetermined threshold.

In particular, the predetermined threshold may be $1*10^6$ S/m and more particular $2*10^6$ S/m and even more particular $3.5*10^6$ S/m.

According to an exemplary embodiment of the electronic module the spacing element material has a thermal conductivity above a predetermined threshold.

In particular, the predetermined threshold may be 50 W/mK at 25° C., preferably 100 W/mK at 25° C., more preferably 150 W/mK at 25° C.

According to an exemplary embodiment of the electronic module the spacing element material is a matrix compound. In particular, the matrix compound may be a metal matrix compound.

The term "matrix compound" or "matrix based material" may particularly denote a material comprising a matrix formed by a base material of the matrix compound in which a further material, the so called reinforcement material, may be included, e.g. by diffusion. In particular, the base material or matrix material may be aluminium or copper, for example.

According to an exemplary embodiment of the electronic module the matrix compound comprises a metallic matrix material. In particular, the matrix material may be a wettable and/or coatable material in order to increase the suitability for soldering.

According to an exemplary embodiment of the electronic module a reinforcement material of the matrix compound, is selected out of the group consisting of: silicon carbide (SiC); tungsten (W); and molybdenum (Mo).

According to an exemplary embodiment of the electronic module the spacer element material is selected out of the group consisting of: AlSiC; CuW; and CuMo.

In particular, the AlSiC material may be so called AlSiC-9, a material comprising 37 vol % of aluminium alloy (e.g. a so called 356.2 aluminium alloy) and 63 vol % of SiC; AlSiC-10, a material comprising 45 vol % of aluminium alloy and 55 vol % of SiC, or AlSiC-12, a material comprising 63 vol % of aluminium alloy and 37 vol % of SiC. It should be mentioned as well that the spacer element material may be selected as well with respect to its wettability and/or coatability. In particular, it should be wettable and/or coatable to a sufficient extend that soldering processes can be performed.

According to an exemplary embodiment of the spacer element material is selected out of the group consisting of AlSiC comprising a SiC content between 25% and 80% by volume, in particular between 30% and 60%; CuW comprising a W content between 20% and 85% by volume; and CuMo comprising a Mo content between 30% and 90% by volume.

According to an exemplary embodiment of the electronic module the first conductive board and or the first carrier comprises a material selected out of the group consisting of: copper and aluminium.

According to an exemplary embodiment of the electronic module the second conductive board or the second carrier comprises a material selected out of the group consisting of: copper and aluminium.

In particular, it may be that the first conductive board and the second conductive board comprises or may consist of the same material, e.g. both may comprise or may consist of copper. It should be mentioned that one or more boards or carriers may be coated as well, e.g. by a NiP coating, for example.

According to an exemplary embodiment of the electronic module the coefficient of thermal expansion of the spacer material is lower than 16 ppm/K.

In particular, the CTE of the spacer material may be lower than 15 ppm/K more preferably the CTE of the spacer material may be in the range between 6 and 16 ppm/K, e.g. in the range between 8 and 14 ppm/K. The values of the CTE given throughout the whole application may be determined as an average value of the CTE determined based on measurements at 20° C. and 300° C.

According to an exemplary embodiment of the electronic module the spacer material coefficient of thermal expansion value is substantially matched with a coefficient of thermal expansion value of the mold compound.

According to an exemplary embodiment of the method the contacting of the spacing element comprises a soldering step.

In particular the spacing element or spacer may be soldered to the electronic chip. The soldering step may comprise the provision of a soldering material and or of a fluxing agent on the electronic chip and/or on the spacing element.

According to an exemplary embodiment of the method the contacting of the second carrier comprises a soldering step.

That is, according to an exemplary embodiment of the electronic module the spacing element is fixed to the electronic chip and/or to the second carrier or second conductive board by a solder structure. In particular, for all soldering steps a soldering material and/or soldering agent may be applied. It should be noted that the soldering step used in contacting the spacing element and the soldering step used in contacting the second carrier may be one single soldering step. For example, a solder paste may be arranged on the electronic chip and/or the spacing element before the spacing element is arranged on the electronic chip. A solder paste may be arranged on the spacing element and/or the second carrier before the second carrier is arranged on the spacing element. Then a single soldering step is used.

In particular, the solder structure may be a solder layer. The solder structure, formed for example by solder balls, solder paste, solder bumps or the like, may provide for an efficient way to electrically and thermally connecting the spacing element and the electronic chip to each other and at the same time providing a sufficiently strong connection between the same.

According to an exemplary embodiment the method further comprises selecting the spacing element material taking into account the coefficient of thermal expansion of the spacing element material.

In particular, the CTE of the spacing material may be arbitrarily considered or taken into account when choosing or selecting the spacing material by comparing and matching the same with CTEs of other materials or components of the electronic module. The selecting may take into account the object or goal to reduce thermomechanical stresses during thermocycles of the use of the electronic module.

According to an exemplary embodiment of the method the selecting further takes into account a coefficient of thermal expansion of the a coefficient of thermal expansions of the first carrier; the coefficient of thermal expansions of the second carrier; the coefficient of thermal expansions of the electronic chip; and the coefficient of thermal expansions of the mold compound.

DETAILED DESCRIPTION OF THE FIGURES

The above and other objects, features and advantages of the present invention will become apparent from the following description and the appended claims, taken in conjunction with the accompanying drawings, in which like parts or elements are denoted by like reference numbers.

The illustration in the drawing is schematically and not necessarily to scale.

Figure 1B:
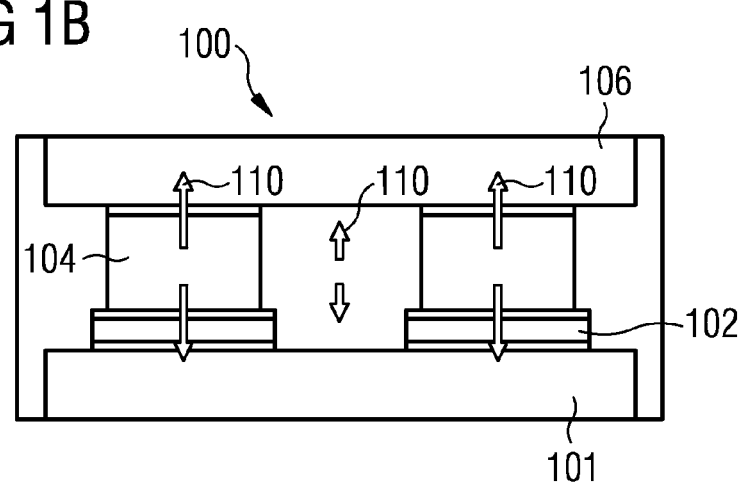
Figure 1C:
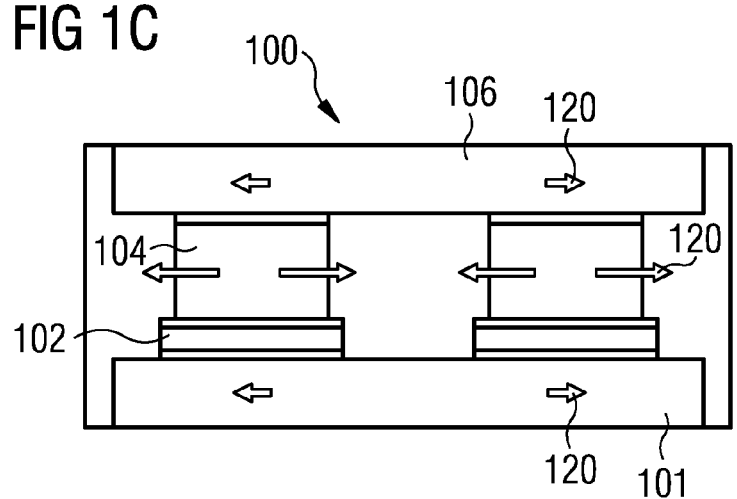

FIG. 1A to 1C show cross sectional views of an electronic module, e.g. a double sided cooled module (DSC-module), according to an exemplary embodiment. In particular, FIG. 1A shows an electronic module 100 comprising a first carrier or first conductive board, e.g. a direct copper bonding (DCB) board, 101 on which electronic chips 102 are arranged. The electronic chips 102 may be fixed to the first carrier by soldering which is indicated in FIG. 1A by a thin layers 103. Furthermore, spacing elements or spacers 104 are arranged or contacted to the electronic chips, which can be as well soldered to the electronic chips indicated by layers 105. As a second outer layer a second carrier or second conductive board 106 is contacted to the spacing element as well by a solder layer 107. Thus, the spacing element or spacer and the second outer layer may be soldered to each other as well. It should be mentioned that the soldering step used for soldering the spacing element to the electronic chip and the soldering step used for soldering the second outer layer onto the spacing element may be two distinct soldering steps or processes or may be performed by a single soldering step or process. This holds true for all of the embodiments described herein. For encapsulating the electronic or electric components at least partially a mold compound 108 is molded, e.g. by a transfer mold process, around the electronic or electric components. In particular, the mold compound may encapsulate the electronic chips, the spacing elements and parts of the first and second carriers, while an outer surface of the first and second carriers may still be exposed so that heat generated by the electronic components, in particular, the electronic chips can be dissipated. In addition the exposed surfaces may be used to discharge or convey heat generated by the electronic chips out of the electronic module.

FIG. 1B and FIG. 1C schematically illustrates mechanical stress or strain which may be induced during a thermocycle of the electronic module. The arrows 110 in FIG. 1B indicate the thermal expansion in a vertical direction in FIG. 1B, i.e. the direction perpendicular to the layered structure of the electronic module 100. FIG. 1B shows tensile stress which acts on the mold compound and may cause delamination of the mold compound from the conductive board. The arrows 120 in FIG. 1C indicate the thermal expansion in a horizontal direction in FIG. 1C, i.e. the direction parallel to the layered structure of the electronic module 100. FIG. 1C shows lateral stress on solder joints and mold compound.

The mechanical stress may in particular induced due to the fact that the different materials of the different components described in connection with FIG. 1A have different coefficient of thermal expansions (CTE). For example, a typical value of a DCB board is about 8 ppm/K, for an electronic chip in the range of 4 ppm/K, for a copper spacer (which is a typical spacer material in the prior art) about 18 ppm/K while a typical mold may have a CTE of about 10 ppm/K. Thus during a thermocycle which can include temperatures between −40° C. and +150° C., mechanical stress will arise which may lead to a delamination and possible breaking of electrical paths to and from the electronic chip.

In order to reduce the thermal stress in particular, the material of the spacing element is matched more closely with the other components of the electronic module with respect to their CTEs. For example, CuW or AlSiC material having an SiC percentage or fraction between 25% and 80% by volume (e.g. the so called AlSiC-9, AlSi-10 or AlSiC-12 materials) may be used which have CTEs between 8 and 12 which is closer to the other CTEs. Thus, when using one of the cited materials for the spacing element, thermal stress may be reduced.

Figure 2:
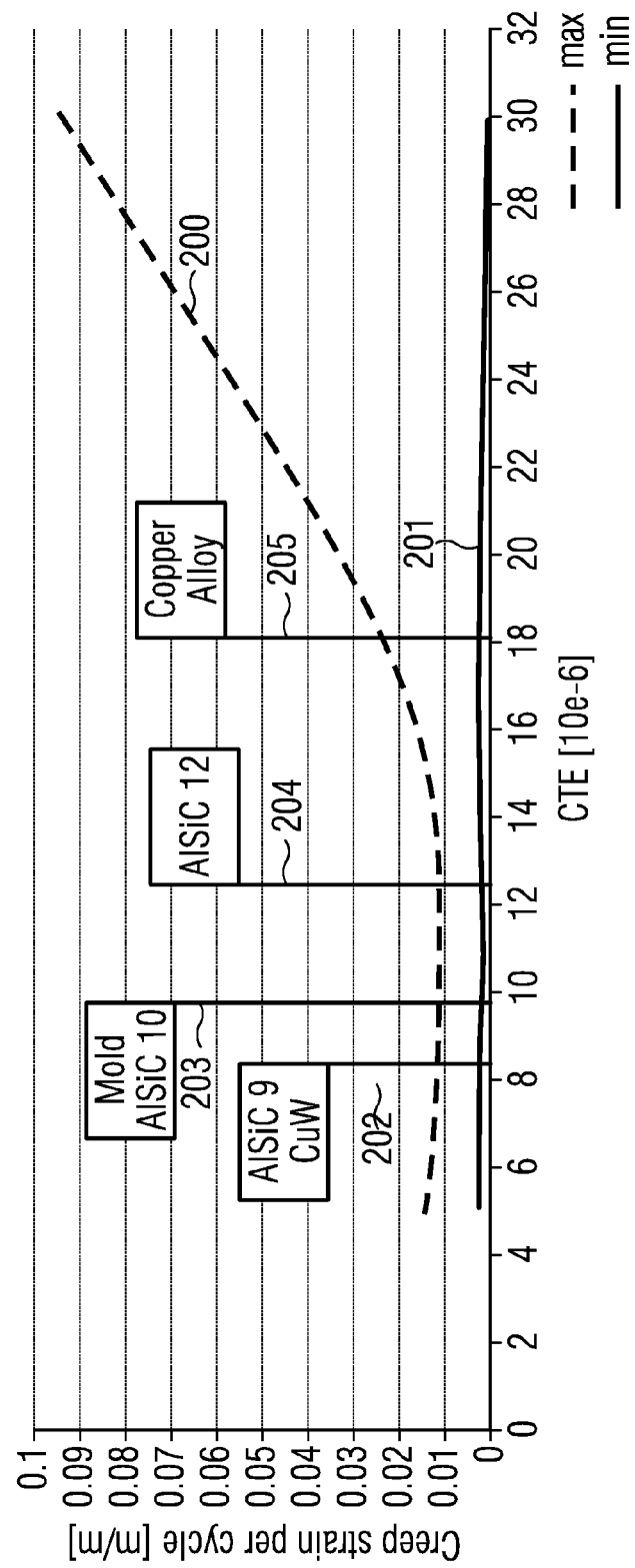
FIG. 2 shows results of simulations concerning creep strain stress.

FIG. 2 shows results of simulations concerning creep strain stress. FIG. 2 shows graphs indicating the simulation results of creep strain stress per cycle in [m/m] vs. CTE of the spacing material in $10^{-6}$ ppm/K. In particular, maximal and minimal stresses are indicated in FIG. 2 by the dotted line 200 and continuous line 201, respectively. As can be seen a nearly constant (low) plateau of maximal stress is present in the range of CTEs between about 7 ppm/K and 14 ppm/K. For reference, some vertical lines are depicted in FIG. 2 as well which indicate the CTE for AlSiC-9/CuW (202), AlSiC-10 (203), AlSiC-12 (204) all of which are lying within the nearly constant plateau. For comparison Cu having a CTE of about 18 ppm/K is as well indicated in FIG. 2 by line 205. As can be seen in FIG. 2 the creep strain stress may be reduced by a factor of more than 2 by using a material for the spacing elements having a matched CTE instead of Cu or a copper alloy. For some further information, some specific values of the materials Cu, CuW, AlSiC-9, AlSiC-10, and AlSiC-12 are given in FIG. 2 as well. With respect to the CTE values of the AlSiC compounds it should be mentioned that these may be determined based on a first measurement at 25° C. and a second measurement at 150° C. to determine an average CTE. It should be mentioned that further characteristics of the AlSiC compounds may be found in "Aluminum Silicon Carbide (AlSiC) Microprocessor Lids and Heat Sinks for Integrated Thermal Management Solutions" of M. A. Occhionero et al., IMAPS Denver 2000.

FIG. 3 shows a schematic flowchart of a method of manufacturing an electronic module according to an exemplary embodiment. In particular, the method 300 comprises providing a first carrier (step 301) which may be for example a DCB or DAB board. Afterwards an electronic chip comprising at least one electronic component is arranged on the first carrier (step 302), e.g. by soldering. Then a spacing element is contacted to the electronic chip (step 303), e.g. as well by soldering. Subsequently a second carrier is contacted to the spacing element (step 304), which again may be performed by a soldering step. Afterwards a molding compound is molded, casted or injected at least partially around the spacing element and the electronic chip (step 305), forming basically the electronic module. It should be noted that the CTE of the spacing element may be selected in a specific selection step in order to match the CTE to the CTEs of other components, e.g. the mold component, so that thermal stress may be reduced during use of the electronic module.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic module comprising,
a first conductive board;
an electronic chip comprising at least one electronic component and arranged on the first conductive board,
a spacing element arranged on the electronic chip and being in conductive connection with the at least one electronic component;
a second conductive board arranged on the spacer spacing element; and
a mold compound enclosing the electronic chip and the spacing element at least partially and wherein the mold has a coefficient of thermal expansion value of x ppm/K;
wherein the spacing element comprises a material having a coefficient of thermal expansion value laying in a range between (x−4)ppm/K and (x+4)ppm/K.

2. The electronic module according to claim 1, wherein the first conductive board comprising a material selected out of the group consisting of:
copper, and
aluminium.

3. The electronic module according to claim 1, wherein the second conductive board comprising a material selected out of the group consisting of:
copper, and
aluminium.

4. The electronic module according to claim 1, wherein the coefficient of thermal expansion of the spacing element material is lower than 16 ppm/K.

5. The electronic module according to claim 1, wherein the spacing element material coefficient of thermal expansion value is substantially matched with a coefficient of thermal expansion value of the mold compound.

* * * * *